United States Patent [19]

Hansen

[11] Patent Number: 5,159,709
[45] Date of Patent: Oct. 27, 1992

[54] ARRANGEMENT HAVING TRACKING IF FILTER

[75] Inventor: Jens Hansen, Berlin, Fed. Rep. of Germany

[73] Assignee: H.U.C. Elektronik GmbH, Berlin, Fed. Rep. of Germany

[21] Appl. No.: 427,844

[22] PCT Filed: Apr. 15, 1988

[86] PCT No.: PCT/DE88/00235
§ 371 Date: Oct. 16, 1989
§ 102(e) Date: Oct. 16, 1989

[87] PCT Pub. No.: WO88/08222
PCT Pub. Date: Oct. 20, 1988

[30] Foreign Application Priority Data

Apr. 15, 1987 [DE] Fed. Rep. of Germany ....... 3712736
Jul. 24, 1987 [DE] Fed. Rep. of Germany ....... 3724604

[51] Int. Cl.⁵ .......................................... H04B 1/16
[52] U.S. Cl. .................................. 455/266; 455/307; 455/340
[58] Field of Search ............... 455/295, 297, 258, 264, 455/266, 307, 308, 338, 339, 340, 192, 182, 183; 333/219, 235

[56] References Cited

U.S. PATENT DOCUMENTS

| | | | |
|---|---|---|---|
| 2,282,974 | 5/1942 | Koch | 455/266 |
| 4,081,771 | 3/1978 | Hendrickson | 455/182 |
| 4,352,208 | 9/1982 | Schroeder | 455/266 |
| 4,356,567 | 10/1982 | Eugchi et al. | 455/266 |
| 4,385,402 | 5/1983 | Barrs | 455/307 |
| 4,406,019 | 9/1983 | Ide et al. | 455/307 |
| 4,458,207 | 7/1984 | Favreau et al. | 455/266 |
| 4,525,868 | 6/1985 | Kage et al. | 455/295 |
| 4,531,148 | 7/1985 | Ohta et al. | 455/340 |
| 4,598,426 | 7/1986 | Shiojima | 455/340 |
| 4,658,438 | 4/1987 | Kamata et al. | 455/192 |

FOREIGN PATENT DOCUMENTS

| | | |
|---|---|---|
| 0048661 | 3/1982 | European Pat. Off. |
| 0075071 | 3/1983 | European Pat. Off. |
| 3147493 | 6/1983 | Fed. Rep. of Germany |
| 2497039 | 6/1982 | France |
| WO8602505 | 4/1986 | PCT Int'l Appl. |
| 903107 | 8/1962 | United Kingdom |

Primary Examiner—Reinhard J. Eisenzopf
Assistant Examiner—Edward Urban
Attorney, Agent, or Firm—Spencer, Frank & Schneider

[57] ABSTRACT

In an FM receiver where the center frequency of an IF filter is varied depending on the received signal, an arrangement is described in which the passband of the retuned IF filter is selected so that a distinct resonance region having a relatively steep-edged drop of at least 6 dB exists in the middle of the channel; a less steep or level curve exists in a region essentially symmetrically spaced from the middle of the channel on both sides of the resonance region; and the pass limits lie essentially in symmetry with the middle of the channel.

14 Claims, 3 Drawing Sheets

FIG. 3
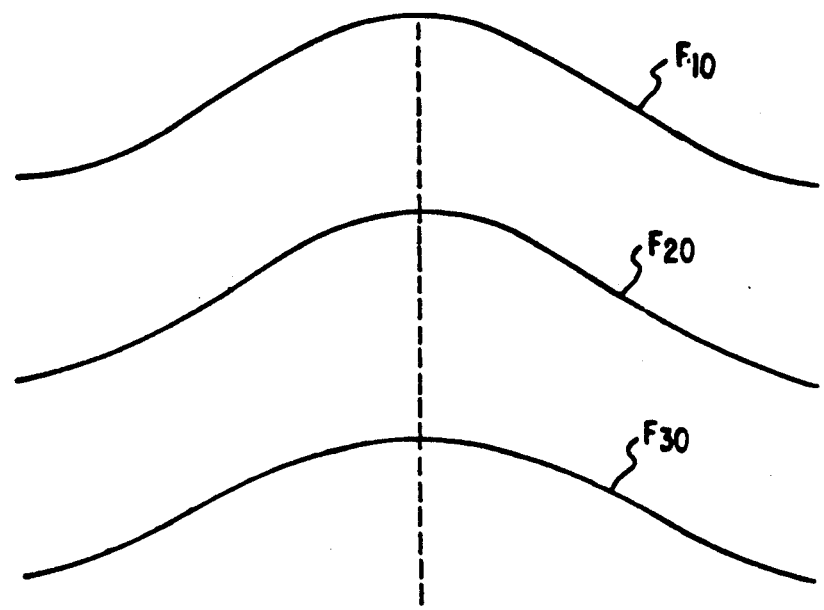
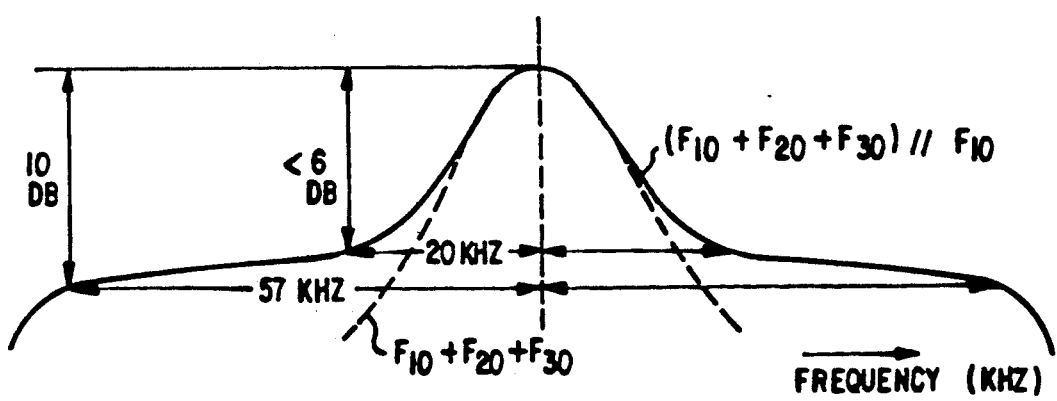
FIG. 1

ARRANGEMENT HAVING TRACKING IF FILTER

BACKGROUND OF THE INVENTION

The invention relates to an arrangement of the type defined in the preamble of claim 1 and to an FM receiver equipped with such an arrangement.

Arrangements of this type are known from DE-OS 3,147,493 and DE-OS 3,438,286, EP-A1-75,071 or FR-OS 8,121,986, all of which originate from the inventor of the present invention.

In presently employed FM radio receivers, a broadband IF filter is provided. The center frequency $f_{IF}$ of such a broadband IF filter is 10.7 MHz in most standards while the channel bandwidth is about 200 kHz ($\pm 100$ kHz symmetrically with respect to the center frequency $f_{IF}$). The passband characteristic is selected in such a manner that its bandwidth corresponds approximately to the transmission bandwidth. Due to the wide bandwidth, a relatively large amount of interference and noise components of the antenna input signal are passed by the prior art IF filter, with the result that relatively high input field strengths are required to ensure a useful signal (modulation) worthy of being received.

To increase reception sensitivity, it is known from the above-mentioned references to use as an IF filter a filter which has a narrow bandwidth relative to the channel bandwidth. The center frequency of this narrow-band IF filter is retuned in dependence on the modulation of the received signal. At any arbitrary point in time, selection thus occurs exactly where the momentary IF happens to be located. This results in much improved suppression of interference and noise components. The bandwidth of this controlled IF filter, which is also referred to in the literature as an "in-channel-select" filter or, abbreviated, "ICS" filter, is about 20 kHz as a result of which, however, only the monophonic useful signal component (L+R component of the useful MPX signal) is passed.

For this reason, it is only possible to operate the ICS filter in parallel with a broadband IF filter in an FM stereo receiver and to effectively connect the ICS filter with the LF stage of the receiver if, in any case, only monophonic reproduction is possible due to a received signal which is too weak or has too much interference (for example, below 25 $\mu$V antenna input voltage).

SUMMARY OF THE INVENTION

In contrast thereto, the invention has the object of achieving in a filter arrangement of the type mentioned above, filtering of the entire signal, particularly the MPX signal, with adequate sensitivity without greatly increased engineering expenditures.

According to the invention, this is accomplished by the characterizing features of claim 1.

Advantageous features of the filter arrangement according to the invention are defined in the dependent claims. They also define an advantageous improvement of an FM stereo receiver equipped with the filter arrangement.

The invention is initially based on the idea that, in order to provide sensitivity, a sharp drop in filtering is required primarily in the immediate region close to the momentary IF so as to achieve a high signal/noise ratio with respect to noise components at that point. In contrast, it is immaterial whether a flat or steeply dropping curve branch exists in the further frequency curve of the filter passband characteristic.

Instead of, for example, a comb filter structure having discrete filter regions, a coherent passband is provided for the two L−R bands and for the ARI/RDS auxiliary carrier of the MPX signal which has a relatively level frequency curve. A narrow, distinctly higher filter passband with a sharp drop in filtering is superposed on this coherent passband around the center frequency $f_{IF}$. The latter range is the cause of high sensitivity. The bandwidth of this narrow steep-edged filter passband is about 20 kHz, while the bandwidth of the remaining filter passband which has a relatively level frequency curve is about 100 kHz, taking into account the actually contradictory requirements for high sensitivity and a broad passband for the complete MPX signal.

Surprisingly, the advantages of the invention are not only an improvement of the transmission behavior of FM stereo signals. It has been found that the discovered curve for the transmission characteristic permits the realization of many improvements in the characteristics of the ICS process in general. The resonance-like raise in the center region results in a significant improvement in the signal to noise ratio. The frequency range of the FM signal which occupy the largest percentage within the power spectrum are transmitted with maximum amplitude within this raised region. Moreover, the resulting edge shapes in the transition region from the raised region to the flatter regions following on the sides, makes possible a linear phase response for the useful signal which contributes to a reduction in non-linear distortion. Additionally, the deviation compatibility is increased.

A particular advantage of the invention is that the discovered frequency response improves the "retunability" of the filters. This is intended to mean the capability of the tunable IF filters to follow the momentary center frequency of the modulation. This reduces, in particular, any possible "constrictions" of the IF at high modulation voltages since the rises of the flanks of the passband characteristic as a whole are less. And this also reduces the expenditures for correcting the filter tuning signal (phase modulation and/or filtering). Moreover, the group delay of the useful signals is reduced so that the times to be compensated during filter retuning become shorter. As a whole, it must be considered that the improvements realized occur in a domain of critical, interfered-with receiving conditions in which the realized improvements signify a considerable increase in "listening pleasure". Experience has shown that suddenly starting interferences in an otherwise high-quality (music) reproduction are considered to be particularly annoying.

BRIEF DESCRIPTION OF THE DRAWINGS

The invention will now be described in greater detail with reference to the drawings, in which:

FIG. 1 shows a passband characteristic of a filter arrangement according to the invention;

FIG. 3 shows pass-band characteristics of the various filter stages provided in FIG. 2, which, when switched together, result in the passband characteristic shown in FIG. 1;

DETAILED DESCRIPTION OF THE INVENTION

Figure 2:
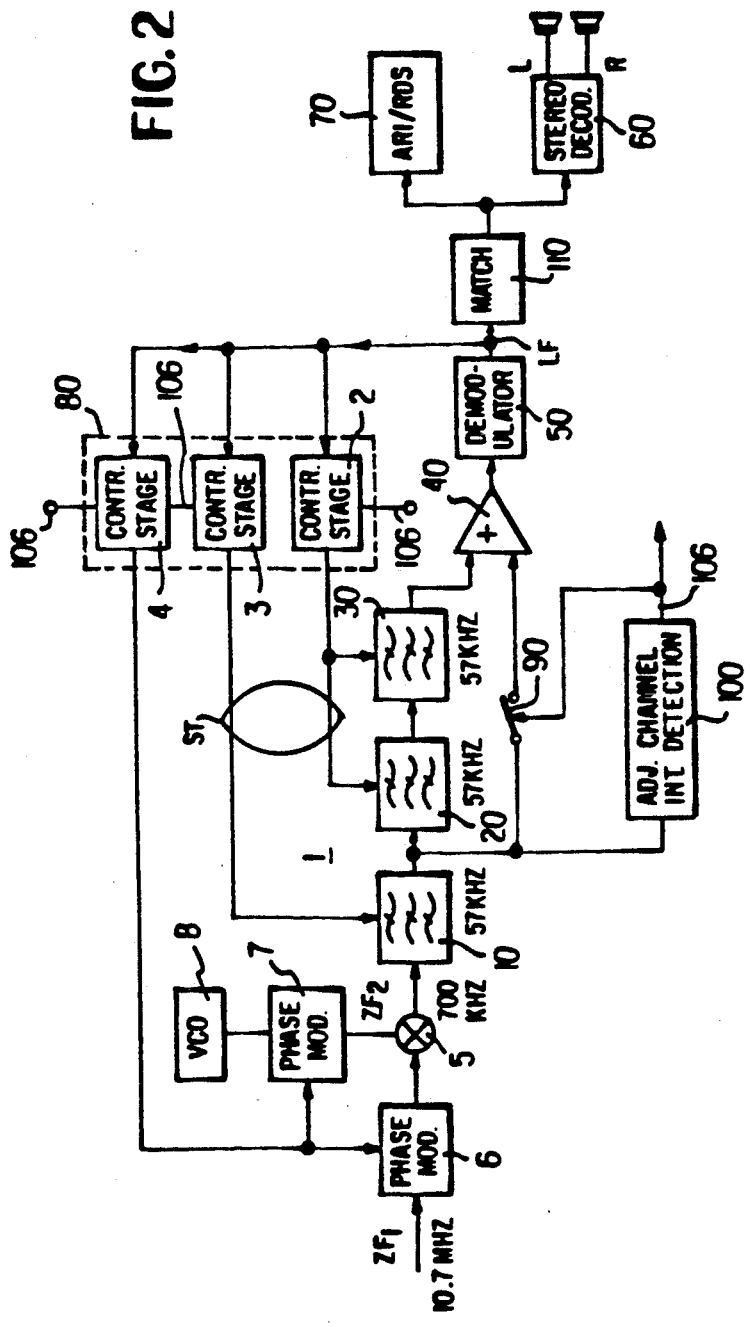
FIG. 2 is a block circuit diagram of a preferred embodiment of an FM stereo receiver (without preselector and mixer stages.

The passband characteristic of FIG. 1, which will be discussed in greater detail below, relates to the transmission behavior of the FM stereo receiver according to the invention, an embodiment of which is shown in FIG. 2. The receiver is illustrated without preselector and mixer stages so that a standard IF signal $IF_1$ at a frequency of 10.7 MHz is present as input signal of the illustrated block circuit diagram.

An essential component of the block circuit according to FIG. 2 is the IF filter arrangement 1 according to the invention, which includes three series-arranged filter stages 10, 20 and 30 in a first, upper filter branch. According to the MPX signal bandwidth of 57 kHz, filter stage 10, which determines the relatively level curve section of the filter passband characteristic according to FIG. 1 and through which pass the higher frequency components of the MPX signal, has a bandwidth of $\pm 57$ kHz, that is approximately 100 kHz. In one favorable embodiment, filter 10 is not—as would correspond to the solidly drawn transmission behavior curve shown in FIG. 3 (also for the other filters)—a single-circuit filter but a two-terminal bandpass filter. The transmission characteristic of this filter, which is more level in this case, is marked $F_{10}$ in FIG. 3 and is shown in dashed lines. The bandwidths of filter stages 20 and 30 are dimensioned in such a manner that the bandwidth of the series circuit of filter stages 10, 20, 30 is approximately 20 kHz.

The MPX ("MPX"=multiplex) signal under consideration is primarily a currently used analog FM stereo radio signal. However, it is easily possible to process a digital FM stereo radio signal with the aid of this filter arrangement.

Connecting the three filter stages 10, 20, 30 in series results in the more narrowband frequency curve $F_{10}+F_{20}+F_{30}$, indicated partially in dashed lines in FIG. 1. The 3 dB bandwidth of this transmission curve, which coincides with that of the solid-line curve, amounts to about 20% of the transmission bandwidth.

The narrow, steep-edged curve is superposed on the curve of passband characteristic $F_{10}$ resulting in the lower curve drawn as a solid line in FIG. 1.

Thus, the solid curve shown in FIG. 1 is composed of a central, resonance-like raised region around the middle of the band. At a distance of about 20% of the total bandwidth—seen from the middle of the band (that is, in the case of an FM stereo transmission about 20 kHz to the sides of the middle of the band)—where the passband characteristic has already dropped by at least 6 dB, the steeply dropping curve changes to a region which drops less steeply. However, down to the (3 dB) band limit, the drop is still more than 4 dB.

This superposition is effected by circuit means in which the output of first filter stage 10 is fed to an adder stage 40 in a second filter branch of filter arrangement 1. The adder stage is also connected to the output of the third filter stage 30. Advisably, adder stage 40 is a summing amplifier which amplifies the filtered IF signal to the required level needed for subsequent demodulation in a demodulator 50. A filter passband characteristic realized in this manner can also be achieved by other circuit means, for example by means of digital filters, without deviating from the concept of the invention.

Between the illustrated, narrowband curve corresponding to the dashed-line contour and the more broadband solid curve, a switch is made as a function of the output signal from a switching stage 100 which is a measure for the characteristics of the received signal. In the illustrated embodiment, this is an adjacent channel interference detector as it will be described in greater detail below.

The demodulated signal, designated by LF, at the output of demodulator 50 is subjected to a level and possibly phase correction by means of a correction stage 110 in order to equalize the different level and phase curves in the two filter branches, that is to say the curves of the two input signals of adder stage 40. The corrected LF signal, which includes all components of the MPX signal, is fed to a stereo decoder 60 and to a ARI/RDS stage 70.

Stereo decoder 60 generates from the $L+R$ and the $L-R$ components the stereophonic left (L) and right (R) informations which are fed to corresponding L and R channels respectively. The ARI/RDS stage filters the modulated 57 kHz auxiliary carrier of the ARI and-/or of the RDS signal out over a narrow band, demodulates it and (in the case of RDS) decodes the additional ARI and RDS signals and evaluates these additional signals. A control stage 80 generates from the LF signal (modulation) at the output of demodulator 50 a positive feedback control signal St which is fed to the control inputs of all filter stages. The additional ARI signal is understood to mean an Auto Radio Information in the form of a traffic station and region detection which is modulated in amplitude modulation onto the 57 kHz auxiliary carrier. The term additional RDS signal is understood to mean a Radio Data System information which is modulated in the form of a digital signal in 2 PSK modulation onto the 57 kHz auxiliary carrier in quadrature position in addition to or independent of the additional ARI signal. In addition to traffic station detection, the RDS information includes a station identification, a program type detection as well as alternate frequencies over which the same program as the tuned-in station is broadcast (see EBU Doc. Tech. 3244 published by the European Broadcasting Union).

Additionally, the LF signal is fed to control stage 80, before or after correction. In a manner to be described in greater detail below, control stage 80 retunes filter stages 10, 20 and 30 to the momentary IF in dependence on the modulation.

Initially, the bottom curve in FIG. 3 will be considered once more. The filter curve designated $2F_{10}+F_{20}+F_{30}$ in FIG. 3 exhibits, in the region of the center frequency $f_{IF}$ retuned to the momentary IF, a sharp drop in filtering of at least 6 dB with a width of approximately 20 kHz. As has already been mentioned, this sharp drop in filtering results from the series connection of filter stages 10, 20, and 30. When the passband of sum curve $F_{10}+F_{20}+F_{30}$ is superposed on the flat passband of curve $F_{10}$ in adder stage 4, the signal levels associated with the passband regions are adjusted in such a manner that the resultant passband of curve $2F_{10}+F_{20}+F_{30}$ is about 10 dB above the passband of curve $F_{10}$ at its point of resonance. This produces relatively level curve branches in a range which is symmetrically spaced from the middle of the channel ($=f_{IF}$) by about 38 kHz, adequate for effective noise and interference suppression of the L−R band in the MPX signal. The pass limits of the overall curve ($F_{10}+F_{20}+F_{30}$)/$F_{10}$ are spaced about 57 kHz from the middle of the channel so that the auxiliary 57 kHz carrier in the MPX signal is also filtered effectively.

In the second filter branch of filter arrangement 1 (FIG. 2), an—already mentioned—electronic switch 90 is provided which is controlled by a stage 100 for detecting adjacent-channel interference. In the illustrated example, stage 100 is fed from the output of the first filter stage and has a switching threshold above which a switching signal is supplied to switch 90. This is so because, if the adjacent channel interference exceeds a limit value, stereo reproduction is no longer meaningful. At that point, the mentioned superposition of the narrow, steep-edged curve $F_{10}+F_{20}+F_{30}$ (FIG. 3) on the flat curve $F_{10}$ is prevented and only the mentioned narrow, steep-edged curve becomes effective for filtering of the IF signal, but only for monophonic signal reproduction. The IF signal resulting in this case at the output of adder stage 40 exhibits a greater selectivity than in the case where switch 90 is closed, as a result of which the detected adjacent-channel interference is masked out and mono reception free of interference is ensured.

The mono/stereo switchover effected by switch 90 may make it possible to omit the presently customary mono/stereo changeover switch in stereo decoder 60.

Figure 5A:
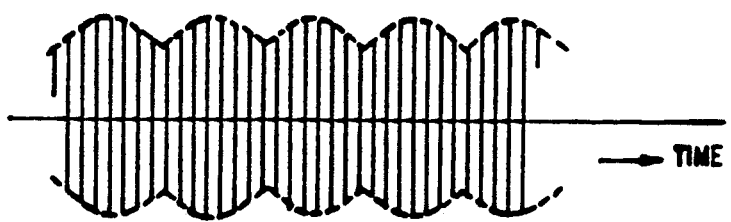
FIGS. 5a to 5d show time diagrams of various signal variations within a stage for detecting adjacent-channel carriers.
Figure 5B:
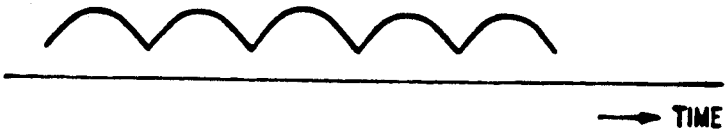
Figure 5C:
Figure 5D:
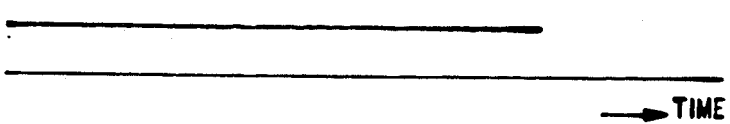
Figure 5E:
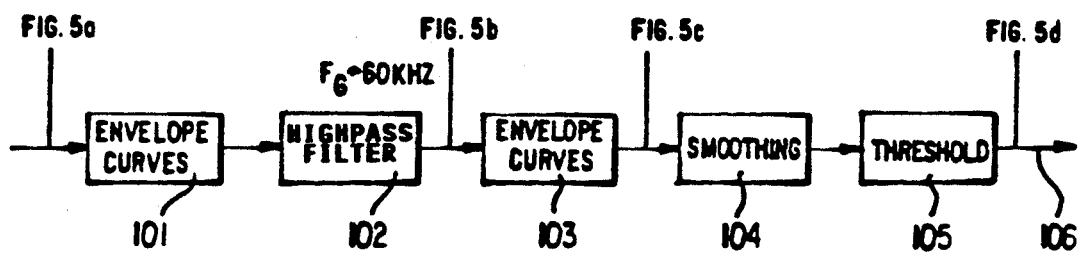
FIG. 5e is the block circuit diagram of an embodiment of a stage for detecting adjacent-channel carriers.

Stage 100, shown in greater detail in FIG. 5e, includes a series connection of
a first envelope curve demodulator 101;
a high-pass filter 102 having a cutoff frequency of about 60 kHz;
a second envelope curve demodulator 103;
a smoothing stage 104; and
a threshold switching stage 105.

Figure 4:
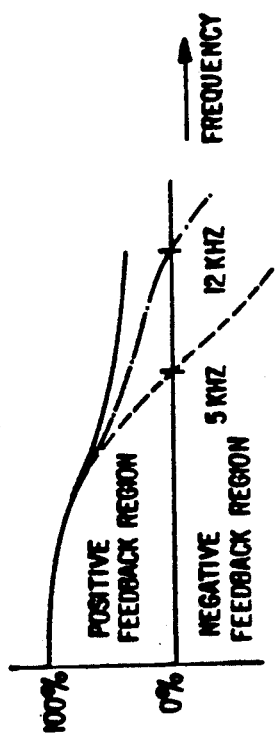
FIG. 4 shows the phase response of an LF signal processed by means of the filter arrangement according to the invention and demodulated in the receiver according to FIG. 5.

Envelope curve demodulator 101 is supplied with the output signal of the first filter stage 10, shown in FIG. 5a, which is amplitude modulated by interferences between useful and adjacent channel. The stronger the adjacent channel carrier, the greater is this amplitude modulation. Low frequency signal components originating from the useful modulation or higher frequency interference components are removed from the demodulated interference signal (FIG. 5b) at the output of envelope curve demodulator 101 by means of a high and/or lowpass filter 102. In the subsequent second envelope curve demodulator 103, the envelope curve (FIG. 5c), which is smoothed by means of stage 104 and compared in the threshold switching stage 105 with a predetermined reference level, is formed via the demodulated, highpass filtered interference signal. If the smoothed envelope curve signal exceeds the reference level, switching stage 105 generates at its output 106 the switching signal shown in FIG. 5d. As is indicated in FIG. 4 by the inputs of stages 2, 3 and 4 marked "106", this switching signal is supplied to control stages 2, 3 and 4 and also to the control input of switch 90. In the control stages 2 and 3, the switching signal causes the frequency components of the control voltages shown there to be slightly dropped, approximately above 6 kHz. In contrast, in control stage 4 for phase modulators 6, 7, the switching signal causes the frequency components of the control voltage generated there to be slightly raised, approximately above 5 kHz. These operations for influencing the frequency response are required because, due to the changed overall filter characteristic of the controlled IF filter stages 10, 20 30, the rate of phase change is increased which, without the mentioned frequency influencing, would lead to an increased interfering phase modulation in the higher frequency range above approximately 5 khz.

In the text which follows, the retuning of filter stages 10, 20 and 30 will be discussed in greater detail. For this purpose, three different phase responses of the LF signal at the output of the demodulator are shown in FIG. 4, the phase response achieved in accordance with the invention being indicated by a solid line. Due to the retuning of the filter stages by means of the LF signal or a control signal derived from it, a phase angle between the IF signal and the control signal occurs which rises with increasing LF signal frequency. Without the measures described below, this phase angle would become so large at about 5 kHz that the positive feedback which is effective up to that point (called the "area of positive phase relationship" in FIG. 4) becomes a negative feedback ("area of negative phase relationship").

Since the phase angle mentioned can be understood to be a phase modulation of the IF signal, the inventor [of the present invention] already had the idea (DE-OS 3,147,493) to subject the IF signal to an opposite phase modulation before filtering in filter stages 10, 20, 30. As can be seen from FIG. 2, a first retuning control signal for filter stages 20 and 30 is generated in a first control stage 2, and a second control signal for first filter stage 10 in a second control stage 3, so as to be active as phase modulator. With the aid of this phase modulation, the phase response with a zero point at 5 kHz, shown in dashed lines in FIG. 4, can be shifted in the direction toward higher frequencies (phase response drawn in dot-dashed lines), so that a zero point, i.e., a change from the desired area of positive phase relationship to the undesirable area of negative phase relationship occurs at about 12 kHz; thus, this measure cannot yet be satisfactory.

In the receiver according to FIG. 2, two further phase modulators 6 and 7 are provided which are jointly controlled by a third control stage 4. Phase modulator 6 is arranged ahead of a mixer stage 5 which converts the incoming standard IF signal $IF_1$ of 10.7 MHz into a second IF signal $IF_2$ of, for example, 700 kHz. For this purpose, a local oscillator 8 is used which is followed by the third phase modulator 7. The control signals of the control stages 2, 3 and 4 and the frequency responses of phase modulators 8, 7 and 10 are matched to one another in such a manner that the phase response, drawn in a solid line in FIG. 4, of the LF signal at the output of demodulator 50 is obtained, which remains in the region of positive phase relationship even at higher LF frequencies. It has been found that, on the basis of the good retunability obtained by the invention, it is possible to omit up to two of the phase modulators, in which case preferably only the phase modulator 6 disposed in the mixer stage would remain.

Using the invention, it is possible for the first time and in a surprising manner to receive an MPX signal with considerably increased sensitivity and to reproduce it in stereo down to about 8 $\mu V$ antenna input voltage. In this arrangement, filter expenditures are no greater than hitherto required for the purely mono solution.

I claim:
1. In an FM receiver arrangement, an IF filter for filtering a received FM signal wherein:

the IF filter has a relatively narrow bandwidth with respect to a channel bandwidth;

the center frequency of the IF filter is retuned in dependence on a received signal modulation; and the IF filter having the retuned center frequency provides a passband, wherein within the passband:
a) a distinct resonance region having a relatively steep-edged drop of at least 6 dB exists in the middle of the channel;
b) a less steep or level curve exists in a region essentially symmetrically spaced from the middle of the channel on both sides of the resonance region; and
c) wherein the pass limits of the IF filter lie essentially in symmetry with the middle of the channel.

2. An arrangement according to claim 1, wherein the steep-edged drop amounts essentially to 10 dB and/or the 3 dB bandwidth is only about 20% of the channel bandwidth.

3. An arrangement according to claim 1, wherein the region having the less steep drop and the essentially level curve on both sides of the middle of the channel begins at a distance of about 20% of the channel bandwidth.

4. An arrangement according to claim 1, wherein the retuned IF filter includes at least two series-connected filter stages having respective output signals, with the output signals of two filter stages being additively linked to form a linked signal and the linked signal which covers a broader frequency range is fed to a subsequent demodulator stage.

5. An arrangement according to claim 4, wherein at least one of the at least two filter stages whose output signals are additively linked is a bandpass filter having a relatively broad passband characteristic.

6. An arrangement according to claim 4, wherein at least one of the at least two filter stages whose output signals are additively linked is a single circuit filter having a relatively narrow passband characteristic.

7. An arrangement according to claim 6, wherein two series connected signal circuit filters are provided which are tuned to the same frequency.

8. An arrangement according to claim 4, wherein the additive linking of the output signal of the first filter stage is effected by controlling a circuit whose output signal is a measure for the reception quality, with the additive linking being suspended below a limit value of the signal which constitutes a measure for the reception quality.

9. An arrangement according to claim 8, wherein the circuit whose output signal is a measure for the reception quality is formed by an adjacent channel detection circuit.

10. An arrangement according to claim 1, wherein the adjacent channel detection circuit includes a series connection composed of the following stages:
a first envelope curve demodulator to which is fed the output signal of the first filter stage amplitude modulated by interferences between useful and adjacent channel;
a high and/or low pass filter which separates the demodulated interference signal at the output of the first envelope curve demodulator from high or low frequency signal components;
a second envelope curve demodulator which forms the envelope curve by way of the demodulated, highpass filtered interference signal, with the level of the envelope curve being a measure for the level of the adjacent channel carrier; and
a threshold switching stage which compares the possibly smoothed envelope curve signal with a predetermined reference level and emits a switching signal if the reference level is exceeded.

11. An FM receiver including an arrangement according to claim 1 to serve as IF filter and a demodulator connected to the output of the IF filter; wherein the demodulator is followed by a correction stage which is of such a configuration that the differences in phase curves and levels resulting from the different group delays and levels of the additively linked filter stages are equalized in the low frequency range.

12. An FM receiver according to claim 11, further comprising at least one control stage and second and third demodulators, wherein
the frequency response of a control voltage of the at least one control stage for the retuned IF filter stages is influenced in such a manner that frequency components, for example above 6 kHz, are lowered slightly; and
each of the frequency responses of control voltages of the second and third phase modulators are influenced in such a manner that high frequency components beginning at about 5 kHz are raised slightly.

13. An FM receiver according to claim 10, wherein a series connection composed of the following stages is provided for adjacent channel detection:
a first envelope curve demodulator to which is fed the output signal of the first filter stage amplitude modulated by interferences between useful and adjacent channel;
a high and/or low pass filter which separates the demodulated interference signal at the output of the first envelope curve demodulator from high or low frequency signal components;
a second envelope curve demodulator which forms the envelope curve by way of the demodulated, highpass filtered interference signal, with the level of the envelope curve being a measure for the level of the adjacent channel carrier; and
a threshold switching stage which compares the possibly smoothed envelope curve signal with a predetermined reference level and emits a switching signal if the reference level is exceeded.

14. In an FM receiver arrangement having an IF filter for filtering a received FM signal in which the center frequency of the IF filter, which has a relatively narrow bandwidth with respect to a channel bandwidth, is retuned in dependence on a received signal modulation, wherein the retuned IF filter includes means for selecting the passband of the retuned IF filter comprising:
first means or providing a distinct resonance region having a relatively steep-edged drop of at least 6 dB in the middle of the channel;
second means for providing a less steep or level curve in a region essentially symmetrically spaced from the middle of the channel on both sides of the resonance region operatively coupled with the first means; and
third means for causing the pass limits to lie essentially in symmetry with the middle of the channel operative coupled to the first and second means.

* * * * *